(12) United States Patent
Ni et al.

(10) Patent No.: US 11,056,411 B2
(45) Date of Patent: Jul. 6, 2021

(54) CHIP PACKAGING STRUCTURE

(71) Applicant: HON HAI PRECISION INDUSTRY CO., LTD., New Taipei (TW)

(72) Inventors: Ching-Yu Ni, New Taipei (TW); Hsiang-Hua Lu, New Taipei (TW); Young-Way Liu, New Taipei (TW)

(73) Assignee: SOCLE TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 16/398,746

(22) Filed: Apr. 30, 2019

(65) Prior Publication Data

US 2020/0279786 A1 Sep. 3, 2020

(30) Foreign Application Priority Data

Feb. 28, 2019 (CN) .......................... 201910153370.1

(51) Int. Cl.
| | |
|---|---|
| *H01L 23/31* | (2006.01) |
| *H01L 23/29* | (2006.01) |
| *H01L 23/52* | (2006.01) |
| *H01L 23/00* | (2006.01) |
| *H01L 23/522* | (2006.01) |
| *H01L 21/56* | (2006.01) |
| *H01L 23/528* | (2006.01) |

(52) U.S. Cl.
CPC .......... *H01L 23/3128* (2013.01); *H01L 21/56* (2013.01); *H01L 23/293* (2013.01); *H01L 23/5226* (2013.01); *H01L 23/5283* (2013.01); *H01L 24/09* (2013.01); *H01L 24/17* (2013.01); *H01L 2224/0231* (2013.01); *H01L 2224/02381* (2013.01)

(58) Field of Classification Search
CPC ............... H01L 23/3128; H01L 23/293; H01L 23/5226; H01L 23/5283; H01L 24/09; H01L 24/17
See application file for complete search history.

(56) References Cited

U.S. PATENT DOCUMENTS

| | | | | |
|---|---|---|---|---|
| 8,459,108 | B2* | 6/2013 | Ohta ................... | G01C 19/5783 73/493 |
| 8,471,383 | B2* | 6/2013 | Hung ................... | H01L 21/568 257/738 |
| 8,492,784 | B2* | 7/2013 | Okamoto ............ | H01L 23/3135 257/98 |
| 8,828,848 | B2* | 9/2014 | Lin ........................ | H01L 24/94 438/464 |

(Continued)

FOREIGN PATENT DOCUMENTS

TW 201824404 A 7/2018

*Primary Examiner* — Ida M Soward
(74) *Attorney, Agent, or Firm* — ScienBiziP, P.C.

(57) ABSTRACT

A chip packaging structure with better reliability includes a first protective layer, a redistribution layer formed on the first protective layer, at least one chip electrically connected to the redistribution layer, and an encapsulating layer covering the redistribution layer, the chip, and the side surfaces of the first protective layer. The first protective layer comprises an exposed surface and at least four side surfaces each connected to the exposed surface. A plurality of second openings is defined in the second protective layer, and a portion of the redistribution layer is exposed from the plurality of second openings.

5 Claims, 8 Drawing Sheets

(56) References Cited

U.S. PATENT DOCUMENTS

| | | | | |
|---|---|---|---|---|
| 9,001,528 B2* | 4/2015 | Yorita | H01L 21/565 |
| | | | 361/816 |
| 9,018,045 B2* | 4/2015 | Yap | H01L 24/96 |
| | | | 438/126 |
| 9,472,425 B2* | 10/2016 | Song | H01L 23/498 |
| 9,502,380 B2* | 11/2016 | Lin | H01L 24/96 |
| 9,543,242 B1* | 1/2017 | Kelly | H01L 23/49822 |
| 9,589,841 B2* | 3/2017 | Chen | H01L 23/49811 |
| 9,704,808 B2* | 7/2017 | Syu | H01L 23/5226 |
| 9,978,654 B2* | 5/2018 | Lin | H01L 21/78 |
| 10,096,563 B2* | 10/2018 | Chen | H01L 24/81 |
| 10,115,674 B2* | 10/2018 | Takano | H01L 23/552 |
| 10,276,508 B2* | 4/2019 | Ho | H01L 24/96 |
| 10,381,301 B2* | 8/2019 | Shih | H01L 25/50 |
| 10,381,312 B2* | 8/2019 | Kim | H01L 23/3135 |
| 10,515,922 B2* | 12/2019 | Chen | H01L 24/97 |
| 10,566,320 B2* | 2/2020 | Shih | H01L 23/3121 |
| 10,714,403 B2* | 7/2020 | Lu | H01L 21/56 |
| 10,796,970 B2* | 10/2020 | Chen | H01L 22/14 |
| 10,797,025 B2* | 10/2020 | Tsai | H01L 23/481 |
| 10,879,224 B2* | 12/2020 | Chen | H01L 23/3121 |
| 2014/0021591 A1* | 1/2014 | Sung | H01L 23/60 |
| | | | 257/659 |
| 2015/0170988 A1* | 6/2015 | Watanabe | H01L 24/97 |
| | | | 257/659 |
| 2017/0077073 A1* | 3/2017 | Lin | H01L 23/49833 |
| 2018/0005916 A1* | 1/2018 | Chen | H01L 25/0655 |
| 2018/0068983 A1* | 3/2018 | Chang | H01L 21/6835 |
| 2018/0122780 A1* | 5/2018 | Chen | H01L 24/19 |
| 2018/0269188 A1* | 9/2018 | Yu | H01L 23/14 |
| 2019/0067145 A1* | 2/2019 | Chun | H01L 23/3128 |
| 2019/0385989 A1* | 12/2019 | Yu | H01L 21/6835 |
| 2020/0111751 A1* | 4/2020 | Chen | H01L 24/19 |
| 2020/0365517 A1* | 11/2020 | Lin | H01L 23/66 |

* cited by examiner

CHIP PACKAGING STRUCTURE

FIELD

The subject matter generally relates to chip packaging technologies.

BACKGROUND

Chip packaging has an important role in integrated circuits. When the size of the integrated circuit reaches very small scales, chips with higher density and higher clock frequency are required, and the chip packaging structure with higher density is needed.

Fan-out wafer-level packaging technology is one packaging technology available. The fan-out wafer-level flow technology offers advantages of miniaturization, low cost, high integration, better performance, and higher energy efficiency.

However, an encapsulating layer of the chip packaging structure manufactured by the fan-out wafer-level flow technology covers only the periphery of the chip. Redistribution layer and protective layer (commonly used as a polyimide (PI) layer) are exposed outside the encapsulating layer, resulting in a height difference between a side surface of the encapsulating layer and a side surface of the protective layer. Thus, the redistribution layer and the protective layer are vulnerable and can be easily broken, reducing reliability of the chip packaging structure.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
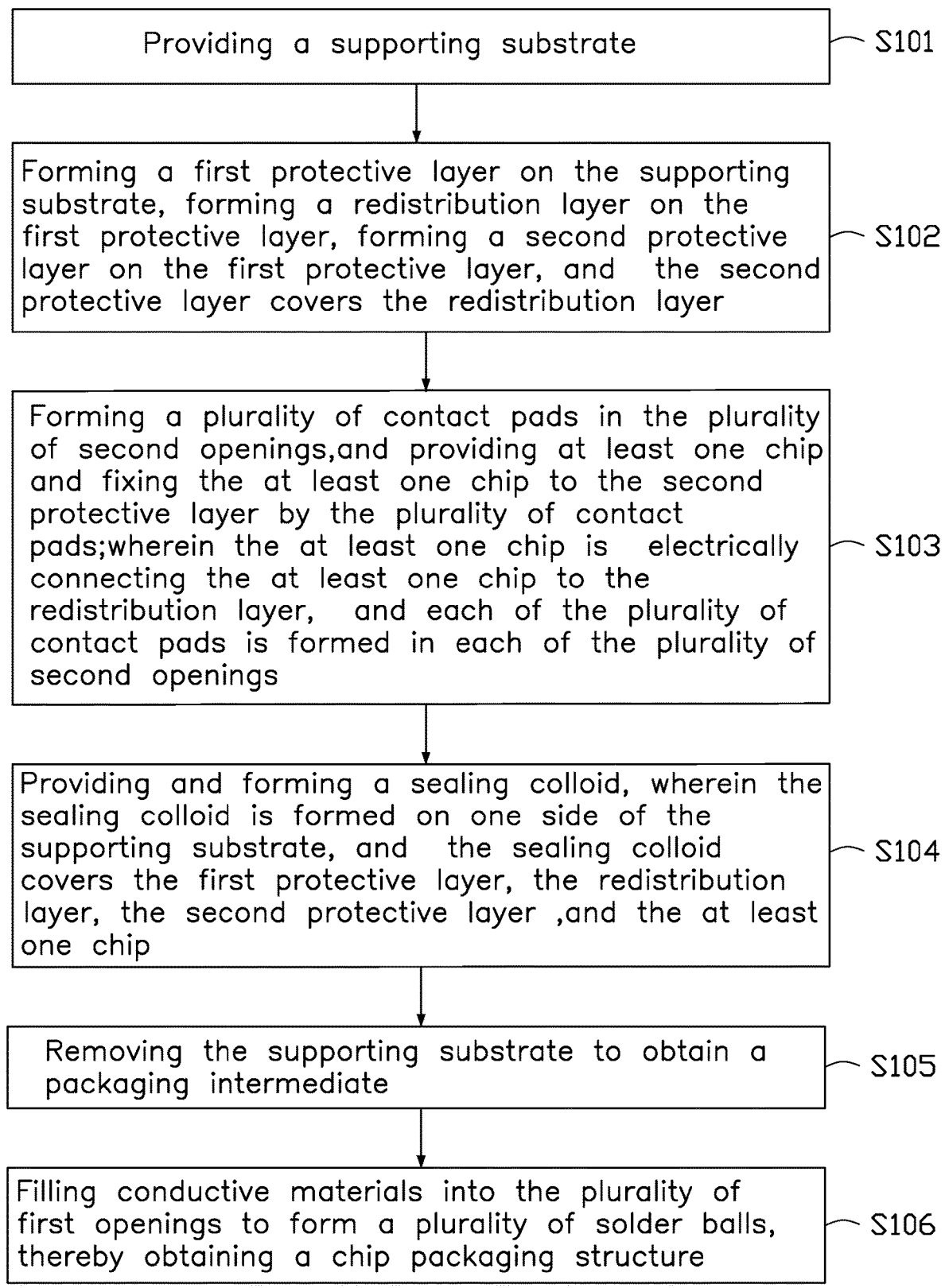
FIG. 1 is a flowchart of an exemplary embodiment of a method for manufacturing a chip packaging structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

FIG. 1 illustrates a flowchart of a method for manufacturing a chip packaging structure. The method is provided by way of example, as there are a variety of ways to carry out the method. The method described below can be carried out using the configurations illustrated in FIGS. 2-7, for example, and various elements of these figures are referenced in explaining example method. Each block shown in FIG. 1 represents one or more processes, methods, or subroutines, carried out in the exemplary method. Furthermore, the illustrated order of blocks is by example only and the order of the blocks can change. Additional blocks may be added or fewer blocks may be utilized, or the order of the blocks may be changed, without departing from this disclosure. The exemplary method can begin at block 101.

Figure 2:
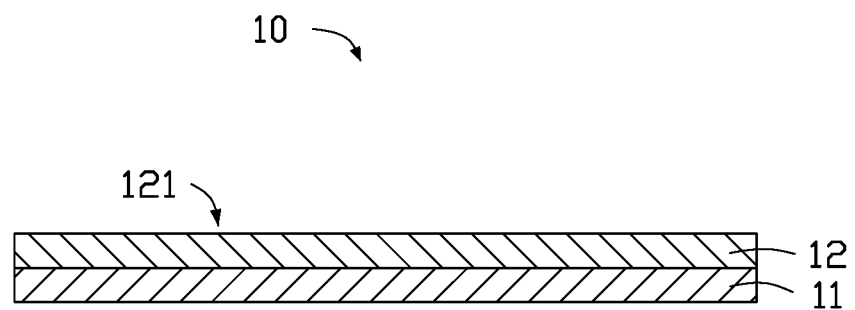
FIG. 2 is a cross-section view of a supporting substrate used in the method of FIG. 1.

At block 101, also illustrated by FIG. 2, a supporting substrate 10 is provided.

The supporting substrate 10 includes a bearing plate 11 and a releasing film layer 12 formed on the bearing plate 11.

Material of the bearing plate 11 is electrically insulating and the bearing plate 11 provides weight bearing.

In at least one embodiment, the material of the bearing plate 11 is polyimide. In other embodiments, the material of the bearing plate 11 may be polyethylene terephthalate, polyethylene naphthalate, ceramic plate, metal plate, or the likes.

The releasing film layer 12 defines a first surface 121. The first surface 121 is opposite to the bearing plate 11.

Material of the releasing film layer 12 may be at least one of polyethylene (PE), polyethylene terephthalate (PET), oriented polypropylene (OPP), polycarbonate (PC), polystyrene (PS), polymethylmethacrylate (PMMA), biaxially-oriented polypropylene (BOPP), poly-4-methyl-1-pentene (TPX), polyvinyl chloride (PVC), polytetrafluoroethylene (PTFE), monocrystalline silicon and polyester.

In at least one embodiment, the material of the releasing film layer 12 is PET.

Figure 3:
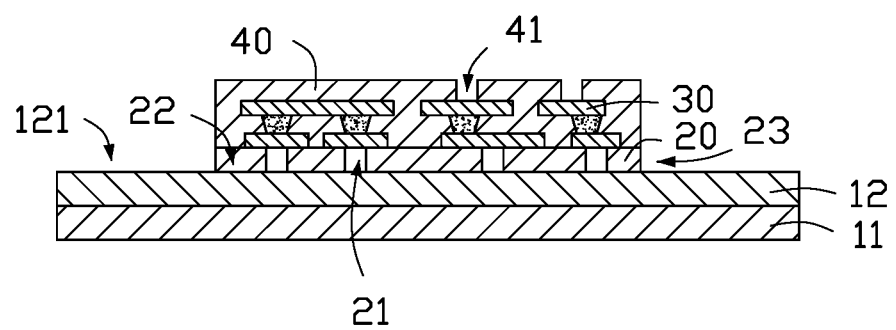
FIG. 3 is a cross-section view showing a first protective layer formed on the supporting substrate of FIG. 1, a redistribution layer formed on the first protective layer, and a second protective layer covering the redistribution layer.

At block 102, also illustrated by FIG. 3, a first protective layer 20 is formed on the first surface 121 of the releasing film layer 12, a redistribution layer 30 is formed on the first protective layer 20, a second protective layer 40 is formed on the first protective layer 20, and the second protective layer 40 covers the redistribution layer 30.

A plurality of first openings 21 is defined in the first protective layer 20. A plurality of second openings 41 is defined in the second protective layer 40. A portion of the redistribution layer 30 is exposed from the plurality of first openings 21 and the plurality of second openings 41.

The first protective layer 20 may be a covering layer or a solder mask layer. In at least one embodiment, the first protective layer 20 is a polyimide covering layer.

Figure 8:
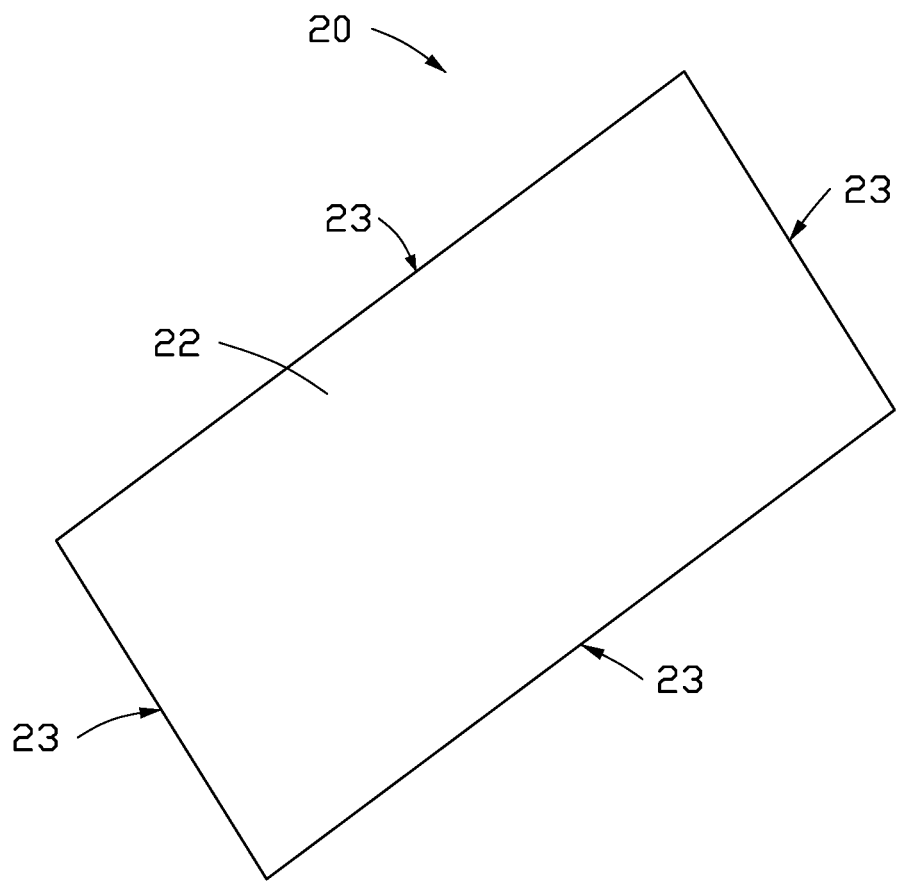
FIG. 8 is a structure view showing a first protective layer formed on the supporting substrate of FIG. 2.

As shown in FIG. 8, the first protective layer 20 includes an exposed surface 22 and at least four side surfaces 23 connecting to the exposed surface 22. The exposed surface 22 abuts against the first surface 121.

The redistribution layer 30 may be made by an electroplating process or an image transfer process. External electronic components can be mounted on the redistribution layer 30.

The second protective layer 40 protects the redistribution layer 30.

The second protective layer 40 may be a covering layer or a solder mask layer. In at least one embodiment, the second protective layer 40 is a polyimide covering layer.

Figure 4:
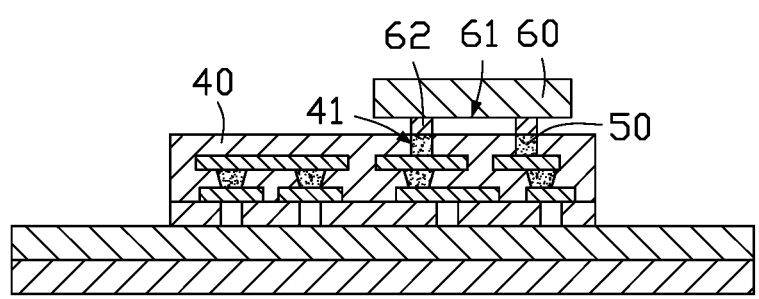
FIG. 4 is a cross-section view showing a chip formed on the second protective layer of FIG. 3.

At block 103, also illustrated by FIG. 4, a plurality of contact pads 50 is formed in each of the plurality of second openings 41, at least one chip 60 is provided and fixed to the second protective layer 40 by the plurality of contact pads 50, and the at least one chip 60 is electrical connected to the plurality of contact pads 50.

The at least one chip 60 includes a second surface 61 facing and parallel to the second protective layer 40. A plurality of conductive bumps 62 is formed on the second surface 61. The plurality of conductive bumps 62 is fixed on the electrical contact pads 50. One conductive bump 62 corresponds to one contact pad 50.

Figure 5:
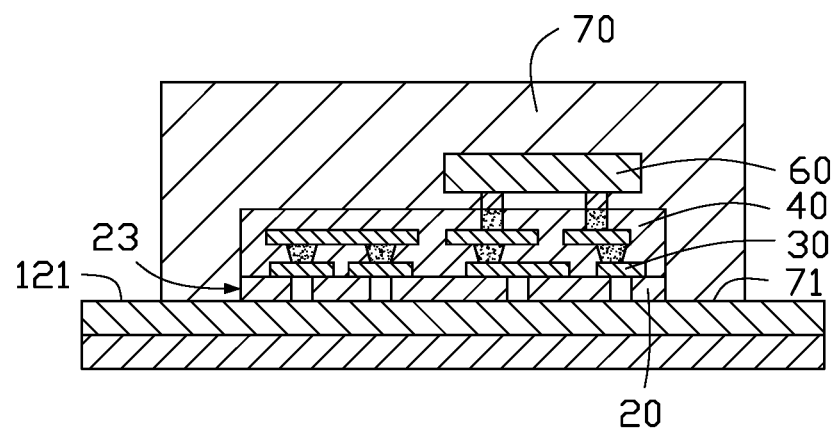
FIG. 5 is a cross-section view showing an encapsulating layer covering the chip of FIG. 4, the redistribution layer of FIG. 3, the first protective layer of FIG. 3, and the second protective layer of FIG. 3.

At block 104, also illustrated by FIG. 5, an encapsulating layer 70 is provided and formed on one side of the supporting substrate 10. The encapsulating layer 70 completely covers the first protective layer 20, the redistribution layer 30, the second protective layer 40, and the at least one chip 60.

The encapsulating layer 70 includes a sealing surface 71 abutting against the first surface 121.

In at least one embodiment, the encapsulating layer 70 is formed by an injection molding process. A method for forming the encapsulating layer 70 by the injection molding process comprises the following steps:

Firstly, a mold (not shown) is first provided. The mold includes a cavity and a glue injection passage. The supporting substrate 10 with the first protective layer 20, the redistribution layer 30, the second protective layer 40, and the at least one chip 60 is received in the cavity.

Secondly, colloids are filled into the cavity through the glue injection passage. The colloids cover the first protective layer 20, the redistribution layer 30, the second protective layer 40, and the at least one chip 60.

Thirdly, the colloids are cured to form the encapsulating layer 70.

Fourthly, bearing plate 10 with the encapsulating layer 70 is taken out from the cavity.

In at least one embodiment, material of the encapsulating layer 70 is epoxy resin. In other embodiments, the material of the encapsulating layer 70 is not limited to epoxy resin, and may be other materials suitable for plastic packaging.

Figure 6:
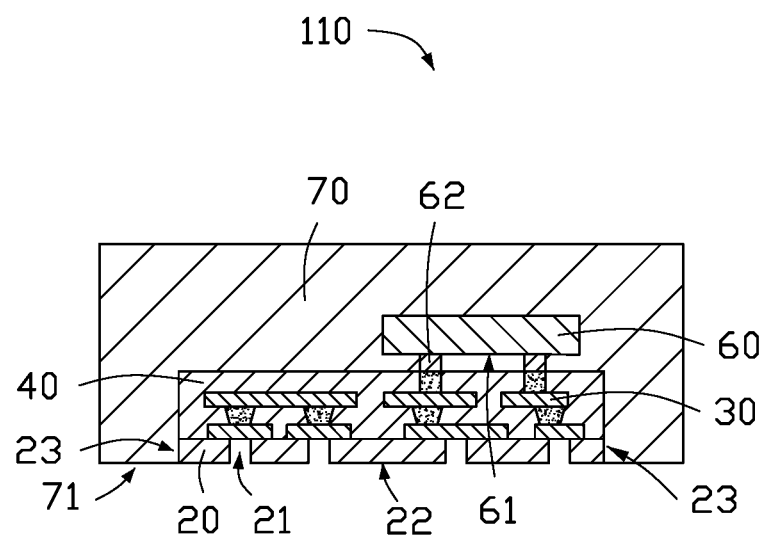
FIG. 6 is a cross-section view showing a packaging intermediate obtained by removing the supporting substrate of FIG. 5.

At block 105, also illustrated by FIG. 6, the supporting substrate 10 is removed to obtain a packaging intermediate 110.

The packaging intermediate 110 includes the first protective layer 20, the redistribution layer 30 formed on the first protective layer 20, the second protective layer 40 covering the redistribution layer 30, the at least one chip 60 formed on the second protective layer 40, and the encapsulating layer 70 covering the first protective layer 20, the redistribution layer 30, the second protective layer 40, and the at least one chip 60. The first protective layer 20 includes the exposed surface 22 and the at least four side surfaces 23 connecting to the exposed surface 22. The exposed surface 22 does not correspond with the redistribution layer 30. The plurality of first openings 21 are defined in the first protective layer 20. The plurality of second openings 41 are defined in the second protective layer 40. A portion of the redistribution layer 30 is exposed from the plurality of first openings 21 and the plurality of second openings 41. The plurality of contact pads 50 is formed in each of the plurality of second openings 41. The at least one chip 60 includes a second surface 61. The second surface 61 faces and is parallel to the second protective layer 40. The plurality of conductive bumps 62 is formed on the second surface 61. The plurality of conductive bumps 62 is fixed on the electrical contact pads 50. One conductive bump 62 corresponds to one contact pad 50. The encapsulating layer 70 completely covers the redistribution layer 30, the second protective layer 40, the at least one chip 60, and the at least four side surfaces 23 of the first protective layer 20. The encapsulating layer 70 defines the sealing surface 71. The sealing surface 71 is coplanar with the exposed surface 22 of the first protective layer 20.

Figure 7:
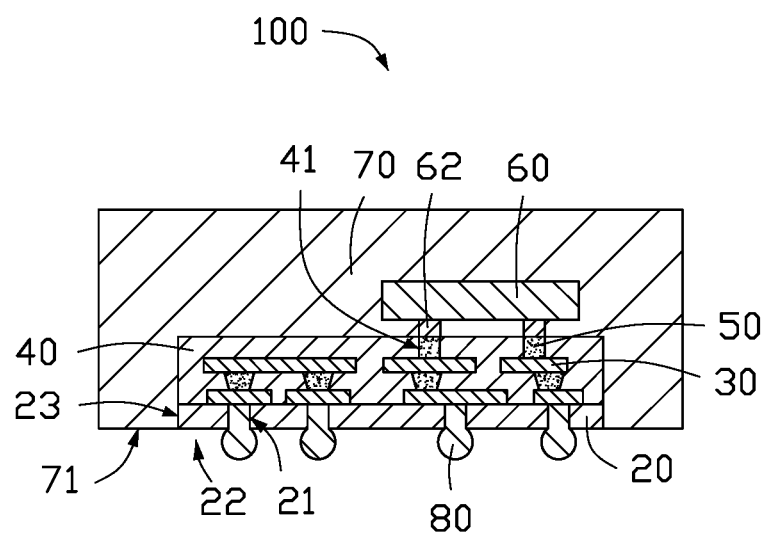
FIG. 7 is a cross-section view showing a chip packaging structure with a plurality of solder balls formed in the first protective layer of FIG. 6.

At block 106, also illustrated by FIG. 7, conductive materials are infilled into the plurality of first openings 21 to form a plurality of solder balls 80, thereby obtaining the chip packaging structure 100.

The plurality of solder balls 80 electrically connect to external electronic components (not shown). The external electronic components may be sensors, printed circuit boards, or the like.

The chip packaging structure 100 includes the first protective layer 20, the redistribution layer 30 formed on the first protective layer 20, and the second protective layer 40 covering the redistribution layer 30. The at least one chip 60 is formed on the second protective layer 40, and the encapsulating layer 70 covers the first protective layer 20, the redistribution layer 30, the second protective layer 40, and the at least one chip 60. The first protective layer 20 defines the exposed surface 22 and the at least four side surfaces 23 connecting to the exposed surface 22. The exposed surface 22 does not correspond to the redistribution layer 30. The plurality of first openings 21 are defined in the first protective layer 20. The plurality of second openings 41 are defined in the second protective layer 40. A portion of the redistribution layer 30 is exposed from the plurality of first openings 21 and the plurality of second openings 41. The plurality of contact pads 50 are formed in each of the plurality of second openings 41. The at least one chip 60 includes the second surface 61 facing and parallel to the second protective layer 40. The plurality of conductive bumps 62 are formed on the second surface 61. The plurality of conductive bumps 62 is fixed on the electrical contact pads 50. One conductive bump 62 corresponds to one contact pad 50. The encapsulating layer 70 completely covers the redistribution layer 30, the second protective layer 40, the at least one chip 60, and the at least four side surfaces 23 of the first protective layer 20. The encapsulating layer 70 includes a sealing surface 71. The sealing surface 71 is flush with the exposed surface 22 of the first protective layer 20.

The chip packaging structure 100 includes the plurality of solder balls 80. One solder ball 80 is formed in one first opening 21. The plurality of solder balls 80 is electrically connected to the redistribution layer 30 and the external electronic components.

With the embodiments described above, the encapsulating layer 70 completely covers the redistribution layer 30, the second protective layer 40, the at least one chip 60, and the at least four side surfaces 23 of the first protective layer 20. The redistribution layer 30 and the first protective layer 20 are thus structurally reinforced, and reliability of the chip packaging structure is enhanced.

The embodiments shown and described above are only examples. Many details are often found in the art such as the other features of a chip packaging structure and a method for manufacturing the same. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A chip packaging structure comprising:
    a first protective layer, wherein the first protective layer comprises an exposed surface and at least four side surfaces each connected to the exposed surface;
    a redistribution layer formed on the first protective layer;
    a second protective layer covering the redistribution layer;
    at least one chip electrically connected to the redistribution layer; and
    an encapsulating layer covering the second protective layer, the chip, and the at least four side surfaces of the first protective layer;
    wherein the encapsulating layer is made of epoxy resin.

2. The chip packaging structure of claim 1, wherein a plurality of first openings is defined in the first protective layer, a portion of the redistribution layer is exposed from the plurality of first openings, the chip packaging structure further comprises a plurality of solder balls, and each of the plurality of solder balls is formed in one of the plurality of first openings.

3. The chip packaging structure of claim 1, wherein a plurality of second openings is defined in the second protective layer, a portion of the redistribution layer is exposed from the plurality of second openings, and a plurality of contact pads are formed in the plurality of second openings; each of the plurality of contact pads is formed in each of the plurality of second openings.

4. The chip packaging structure of claim 3, wherein the at least one chip comprises a second surface, the second surface faces is parallel to the second protective layer, a plurality of conductive bumps is formed on the second surface, the plurality of conductive bumps is fixed on the plurality of electrical contact pads, each of the plurality of conductive bumps corresponds to each of the plurality of contact pads.

5. The chip packaging structure of claim 1, wherein the encapsulating layer comprises a sealing surface, the sealing surface is coplanar with the exposed surface of the first protective layer.

* * * * *